(12) United States Patent
Tian et al.

(10) Patent No.: US 9,285,844 B2
(45) Date of Patent: Mar. 15, 2016

(54) CHASSIS WITH HORIZONTAL PLUGGED FRAMES AND COMMUNICATION DEVICE

(75) Inventors: Weiqiang Tian, Shenzhen (CN); Bailin Long, Shenzhen (CN); Tao Huang, Shenzhen (CN); Fei Nie, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 709 days.

(21) Appl. No.: 13/465,254

(22) Filed: May 7, 2012

(65) Prior Publication Data

US 2012/0218709 A1 Aug. 30, 2012

Related U.S. Application Data

(63) Continuation of application No. PCT/CN2011/071186, filed on Feb. 23, 2011.

(30) Foreign Application Priority Data

Mar. 11, 2010 (CN) .......................... 2010 1 0124449

(51) Int. Cl.
*H05K 7/20* (2006.01)
*G06F 1/20* (2006.01)

(52) U.S. Cl.
CPC .............. *G06F 1/20* (2013.01); *H05K 7/20572* (2013.01)

(58) Field of Classification Search
USPC ........ 361/695, 693, 679.49, 679.48, 678, 675
See application file for complete search history.

(56) References Cited

U.S. PATENT DOCUMENTS

| | | | |
|---|---|---|---|
| 6,119,768 A * | 9/2000 | Dreier et al. ............. | 165/104.33 |
| 6,512,672 B1 | 1/2003 | Chen | |
| 7,158,379 B2 * | 1/2007 | Sanders ............. | H05K 7/20154 361/692 |
| 2007/0146988 A1 | 6/2007 | Yamagishi et al. | |

FOREIGN PATENT DOCUMENTS

| | | |
|---|---|---|
| CN | 2770288 Y | 4/2006 |
| CN | 2879567 Y | 3/2007 |
| WO | WO 02/071820 A1 | 9/2002 |

OTHER PUBLICATIONS

Written Opinion of the International Searching Authority dated Jun. 2, 2011 in connection with International Patent Application No. PCT/CN2011/071186.
Partial translation of Office Action dated May 9, 2013 in connection with Chinese Patent Application No. 201010124449.0.
English language International Search Report from the State Intellectual Property Office of P.R. China for International Application No. PCT/CN2011/071186 mailed Jun. 2, 2011.

\* cited by examiner

*Primary Examiner* — Robert J Hoffberg
*Assistant Examiner* — Hung Dang

(57) ABSTRACT

A chassis with horizontal plugged frames includes an air inlet, a board area, a first air chamber, a second air chamber, and an air outlet. The air inlet is set in the board area and is linked to the first air chamber; the air outlet is set on a wall of the second air chamber where the second air chamber contacts external air; and the first air chamber is located on one side of the board area, and the second air chamber is located on the other side of the board area.

14 Claims, 6 Drawing Sheets

CHASSIS WITH HORIZONTAL PLUGGED FRAMES AND COMMUNICATION DEVICE

CROSS-REFERENCE TO RELATED APPLICATIONS

This application is a continuation of International Application No. PCT/CN2011/071186, filed on Feb. 23, 2011, which claims priority to Chinese Patent Application No. 201010124449.0, filed on Mar. 11, 2010, both of which are hereby incorporated by reference in their entireties.

FIELD OF THE INVENTION

The present invention relates to the communication device field, and in particular, to a chassis with horizontal plugged frames and a communication device.

BACKGROUND OF THE INVENTION

In a common design of a chassis with horizontal plugged frames, a system air duct is generally designed as a left-to-right air duct or a right-to-left air duct, so that air flows directly through surfaces of boards. This reduces system resistance and eases implementation of heat dissipation. However, this also brings some potential impacts on the heat dissipation. For example, if such air ducts are disposed in a cabinet that houses multiple devices, the air ducts of the cabinet may be in disorder. In this case, hot air may reflow and therefore affect the normal running of the devices.

A design of a chassis with horizontal plugged frames in the prior art is as shown in FIG. 1. Fans are placed on one side of the chassis, and an air inlet is set on the top or at the bottom of a board area. With this structure, air enters from the front and expels from the rear of the system for the heat dissipation of the boards in the chassis with horizontal plugged frames.

Regarding this design in the prior art, because the air inlet is set on the top or at the bottom of the board area, the air volume is unevenly distributed to the board area, which reduces efficiency of heat dissipation. In addition, because two layers of fans are disposed, the space of the chassis with horizontal plugged frames is enlarged, which reduces cost-effectiveness of heat dissipation.

SUMMARY OF THE INVENTION

Embodiments of the present invention provide a chassis with horizontal plugged frames and a communication device to increase efficiency and cost-effectiveness of heat dissipation for a chassis.

An embodiment of the present invention provides a chassis with horizontal plugged frames, including:

an air inlet, a board area, a first air chamber, a second air chamber, and an air outlet. The air inlet is set in the board area and is linked to the first air chamber; the air outlet is set on the rear wall of the second air chamber, or the front wall of the second air chamber, or on the side wall where the second air chamber contacts external air; and the first air chamber is located on one side of the board area, and the second air chamber is located on the other side of the board area.

An embodiment of the present invention provides a communication device, including a plurality of boards and a chassis with horizontal plugged frames. The chassis with horizontal plugged frames includes an air inlet, a board area, a first air chamber, a second air chamber, and an air outlet. The air inlet is set in the board area and is linked to the first air chamber; the air outlet is set on the rear wall of the second air chamber, or the front wall of the second air chamber, or on the side wall where the second air chamber contacts external air; and the first air chamber is located on one side of the board area, and the second air chamber is located on the other side of the board area. The plurality of boards are inserted in the board area.

Through the foregoing technical solutions according to the embodiments of the present invention, air enters the first air chamber in the chassis with horizontal plugged frames through the air inlet that is located in the board area, and flows towards the board area after being sufficiently mixed in the first air chamber. In this way, the air volume is evenly distributed to the board area, which increases the efficiency of heat dissipation. In addition, because the air inlet is located in the board area, it is not necessary to expand the space of the chassis with horizontal plugged frames. This makes the chassis compact and increases the cost-effectiveness of heat dissipation.

BRIEF DESCRIPTION OF THE DRAWINGS

To make the technical solutions according to the embodiments of the present invention or in the prior art clearer, the following outlines accompanying drawings required for describing the embodiments or the prior art. Apparently, the accompanying drawings outlined below are merely some embodiments of the present invention, and those of ordinary skill in the art may further obtain other drawings from these accompanying drawings without making creative efforts.

DETAILED DESCRIPTION OF THE EMBODIMENTS

The technical solutions according to the embodiments of the present invention are described clearly and completely with reference to the accompanying drawings in the embodiments of the present invention. Apparently, the embodiments to be described are merely part of rather than all of the embodiments of the present invention. All other embodiments obtained by those of ordinary skill in the art based on the embodiments of the present invention without creative efforts shall fall within the protection scope of the present invention.

Figure 1:
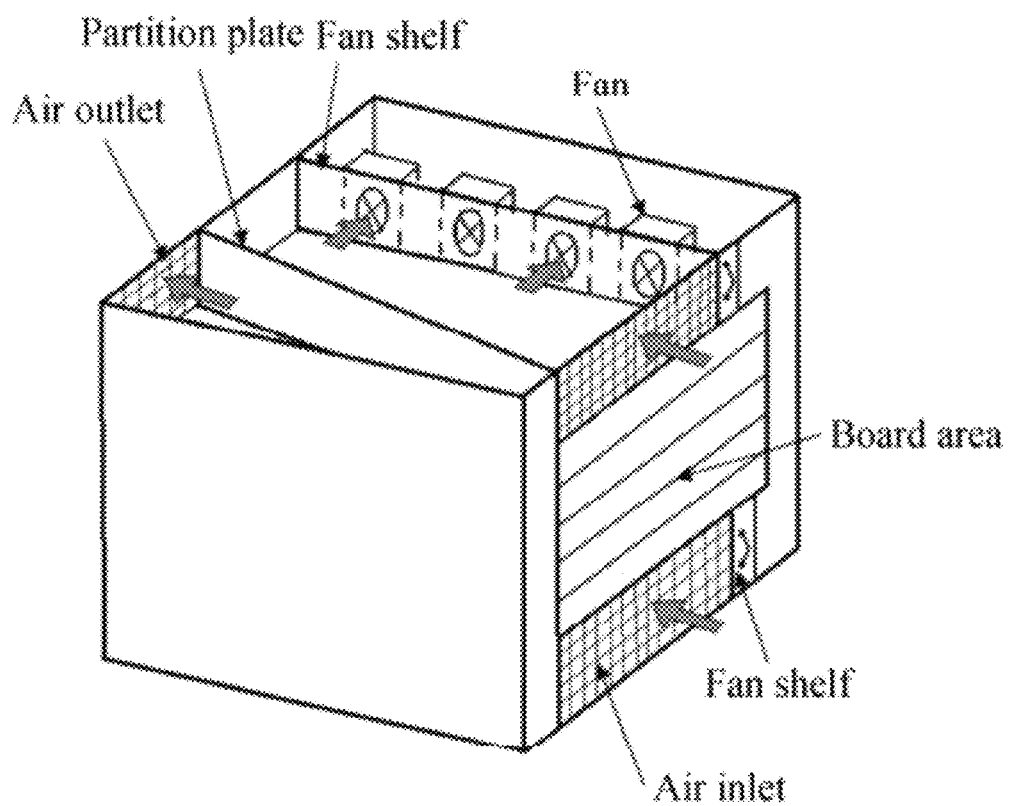
FIG. 1 is a schematic structural diagram of a chassis with horizontal plugged frames in the prior art.
Figure 2:
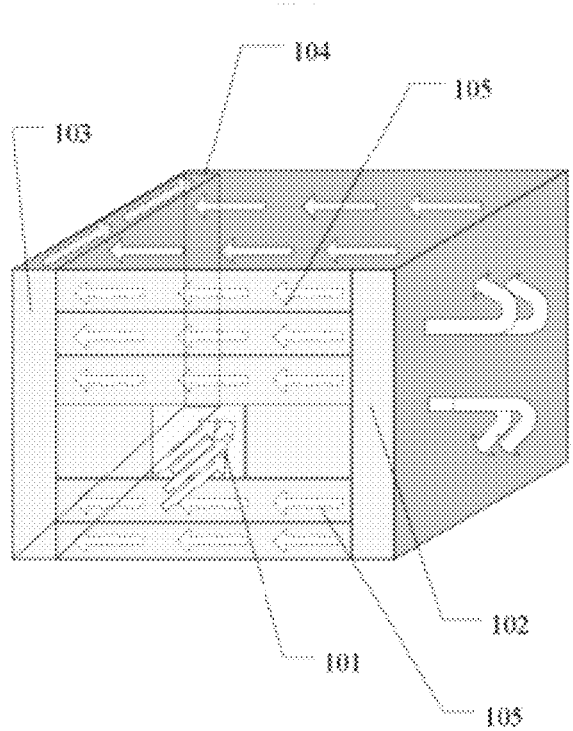
FIG. 2 is a schematic structural diagram of a chassis with horizontal plugged frames according to an embodiment of the present invention.

FIG. 2 is a schematic structural diagram of a chassis with horizontal plugged frames according to an embodiment of the present invention. The chassis with horizontal plugged frames includes an air inlet 101, a board area 105, a first air chamber 102, a second air chamber 103, and an air outlet 104.

According to FIG. 2, the air inlet 101 is set in the board area 105. In an embodiment, the air inlet 101 may be set in the central part of the board area 105. In an embodiment, the air inlet 101 may also be laterally set at a preset position in the board area 105, for example, in the middle-lower part of the board area 105, lower left part of the board area 105, or upper right part of the board area 105. The air inlet 101 is linked to the first air chamber 102.

In this embodiment, the first air chamber 102 is located on one side of the board area 105, and the second air chamber 103 is located on the other side of the board area 105. In actual application, the first air chamber 102 may be located on the right side of the board area 105, and the second air chamber 103 may be located on the left side of the board area 105, as shown in FIG. 2. In some embodiments, the first air chamber 102 may be located on the left side of the board area 105, and the second air chamber 103 may be located on the right side of the board area 105. The positions of the first air chamber 102 and the second air chamber 103 are not specifically limited in the embodiments of the present invention.

The air outlet 104 is set on the second air chamber 103. In an embodiment, the air outlet 104 may be set on the rear wall of the second air chamber, as shown in FIG. 2; in an embodiment, the air outlet 104 may also be set on the front wall of the second air chamber; in an embodiment, the air outlet 104 may also be set on the side wall of the second air chamber. The position of the air outlet 104 is not specifically limited in the embodiments of the present invention.

In an embodiment, as indicated by the arrows in the figure, external air enters the chassis with horizontal plugged frames through the air inlet 101, and then flows towards the first air chamber 102 that is linked to the air inlet 101 and located on one side of the board area 105. After being evenly mixed in the first air chamber 102, the air is evenly distributed to respective boards in the board area 105 to dissipate heat of the respective boards in the board area 105. After heat dissipation for the board area 105, air heats up and become hot air, and is converged in the second air chamber 103 that is located on the other side of the board area, and then is expelled from the chassis with horizontal plugged frames through the air outlet 104 that is set in the second air chamber 103.

Figure 3:
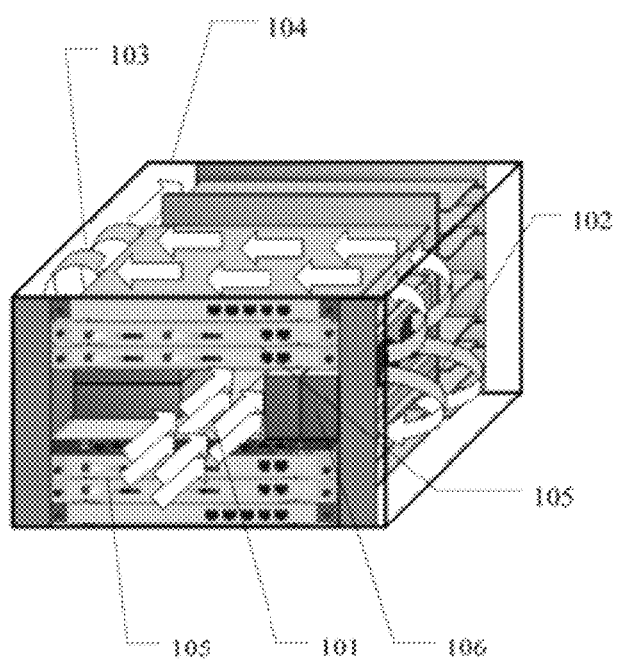
FIG. 3 is a schematic structural diagram of a chassis with horizontal plugged frames according to an embodiment of the present invention.
Figure 4:
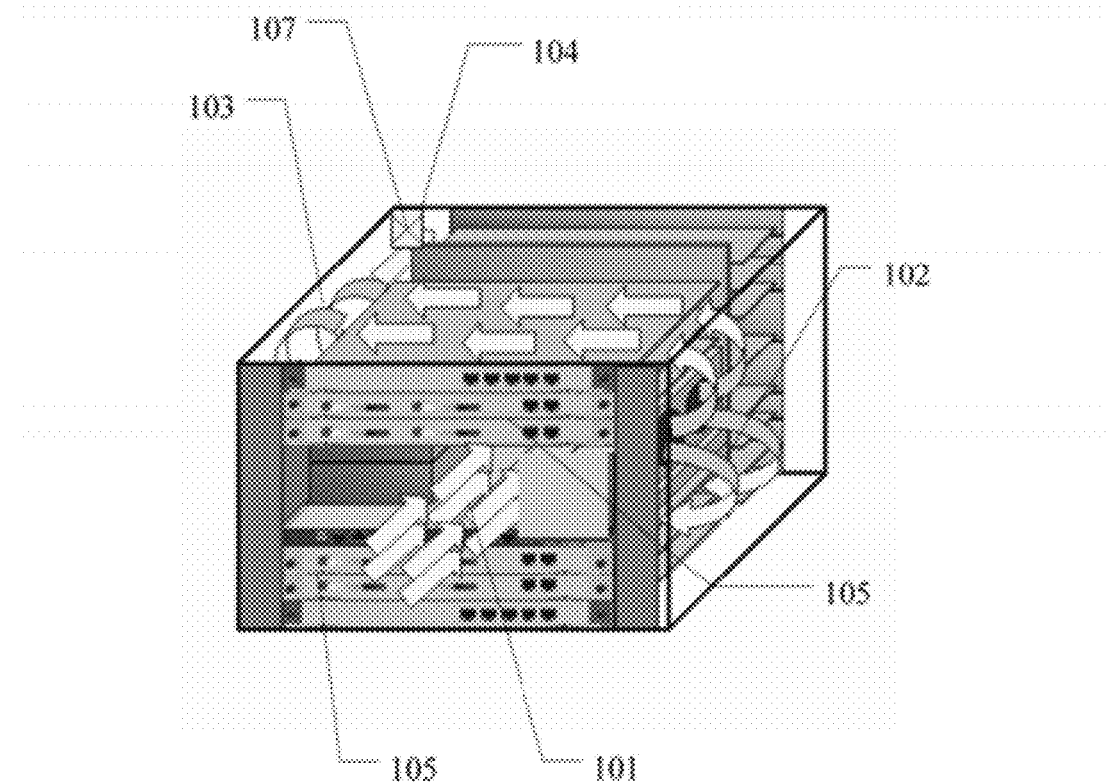
FIG. 4 is a schematic structural diagram of a chassis with horizontal plugged frames according to an embodiment of the present invention.

As shown in FIG. 3, in an embodiment, a fan 106 may be set in the linking area between the air inlet 101 and the first air chamber 102; as shown in FIG. 4, in an embodiment, a fan 107 may be set at the air outlet 104 in the second air chamber 103. In some embodiments, the fan 106 may be set in the linking area between the first inlet 101 and the first air chamber 102, and the fan 107 is also set at the air outlet 104 in the second air chamber 103. In this way, the air flow may be accelerated by setting a fan in the linking area between the air inlet 101 and the first air chamber 102 and/or setting a fan at the air outlet in the second air chamber, which further increases efficiency of heat dissipation.

Figure 5:
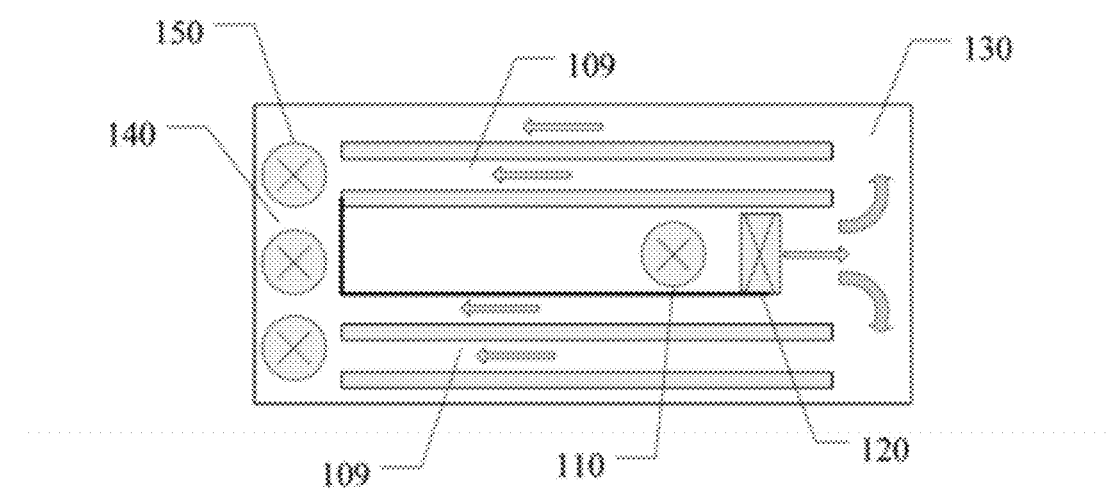
FIG. 5 is a front view of a chassis with horizontal plugged frames according to an embodiment of the present invention.
Figure 6:
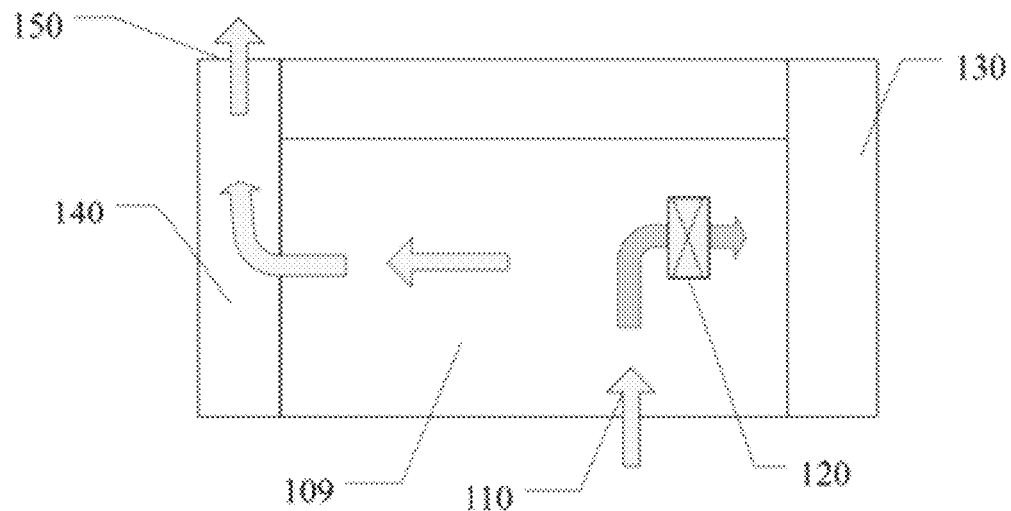
FIG. 6 is a top view of a chassis with horizontal plugged frames according to an embodiment of the present invention.

FIG. 5 is a front view of a chassis with horizontal plugged frames according to an embodiment of the present invention, and FIG. 6 is a top view of a chassis with horizontal plugged frames according to an embodiment of the present invention. In FIGS. 5 and 6, a fan 120 is set in a linking area between an air inlet 110 and a first air chamber 130.

According to FIGS. 5 and 6, air enters the chassis with horizontal plugged frames through the air inlet 110. Under the effect of the fan 120, air flows towards the first air chamber 130, passes through the first air chamber 130, and then flows towards a board area 109 to dissipate heat of boards in the board area 109. Finally, air flows towards a second air chamber 140 and is then expelled through an air outlet 150 in the second air chamber 140. In FIGS. 5 and 6, the air outlet 150 is set on the rear wall of the second air chamber 140. In some embodiments, the air outlet 150 may be set on the front wall of the second air chamber 140 or on the side wall where the second air chamber 140 contacts external air. The position of the air outlet 150 is not specifically limited in the embodiments of the present invention.

Figure 7:
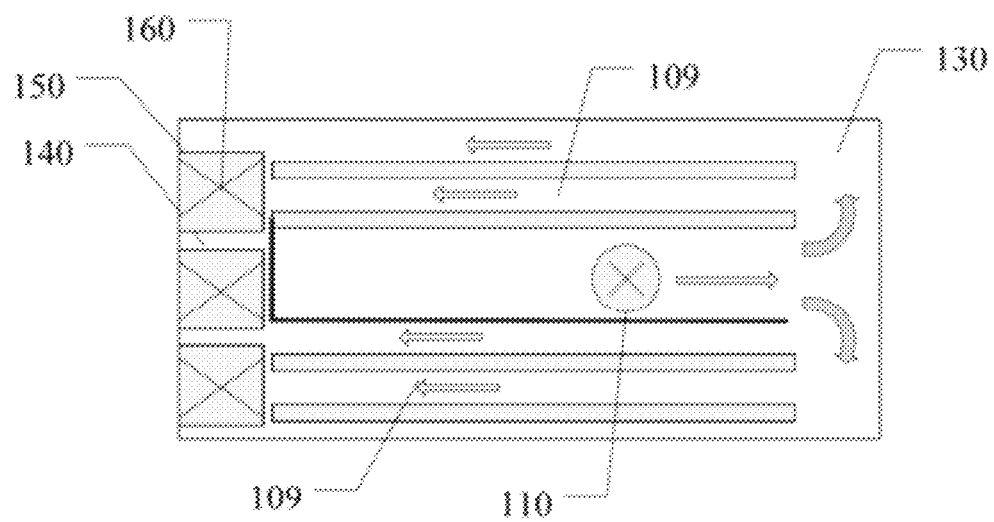
FIG. 7 is a front view of a chassis with horizontal plugged frames according to an embodiment of the present invention.
Figure 8:
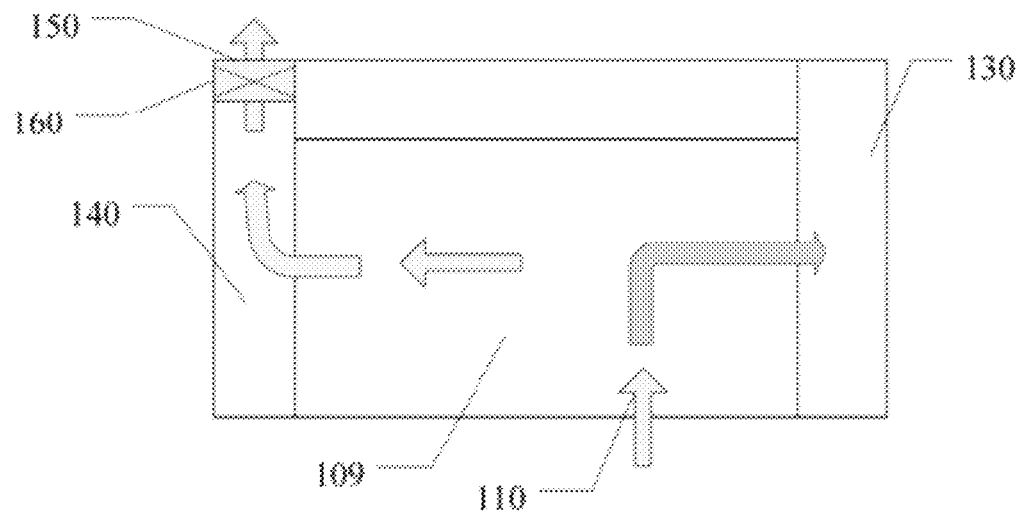
FIG. 8 is a top view of a chassis with horizontal plugged frames according to an embodiment of the present invention.

In an embodiment as shown in FIG. 7 (front view) and FIG. 8 (top view), the fan 120 is not set in the linking area between the air inlet 110 and the first air chamber 130; instead, a fan is set at the air outlet 150, as indicated by a fan 160 in the figure. Under the effect of the fan 160, the hot air flow is expelled from the second air chamber 140 through the air outlet 150.

Figure 9:
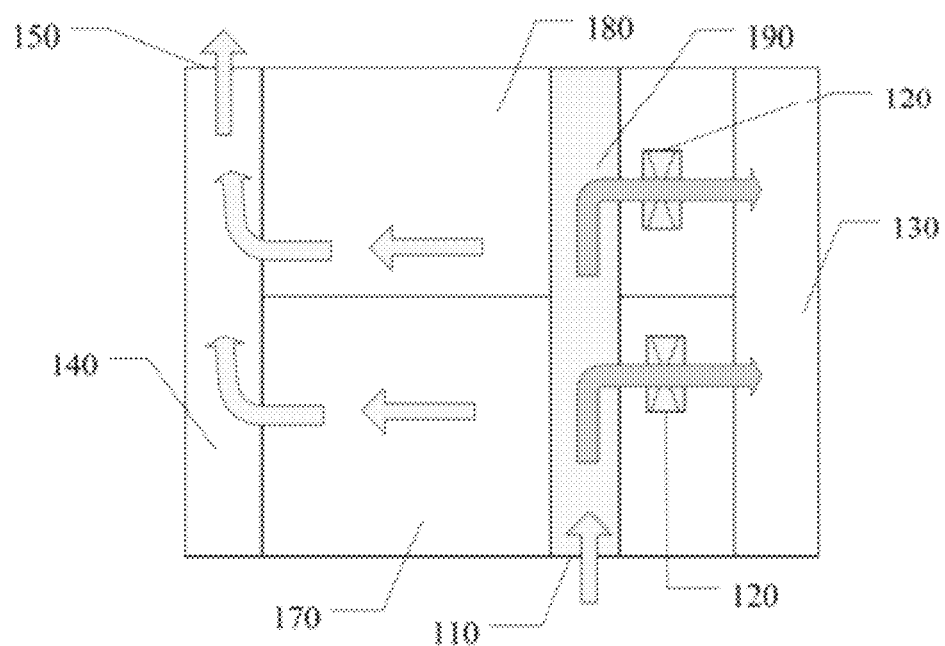
FIG. 9 is a top view of a chassis with horizontal plugged frames according to an embodiment of the present invention.

It should be noted that, the solutions according to the foregoing embodiments may also be applied to a chassis with horizontal plugged frames in which front boards and rear boards are installed oppositely. FIG. 9 is a top view of a chassis with horizontal plugged frames in which front boards and rear boards are installed oppositely by taking an air inlet as a reference direction according to an embodiment of the present invention. In this case, an original board area may include a front board area 170 and a rear board area 180, and an air inlet 110 is located in the front board area. According to FIG. 9, the air inlet 110 in the front board area 170 may be linked to the rear board area 180 through a front-to-rear channel 190.

According to FIG. 9, air enters the chassis with horizontal plugged frames through the air inlet 110. Under the effect of the fan 120, air flows towards the first air chamber 130, passes through the first air chamber 130, and then flows towards the front board area 170 and the rear board area 180 to dissipate heat of boards in the front board area 170 and the rear board area 180. Finally, air flows towards the second air chamber 140 and is then expelled through the air outlet 150 in the second air chamber 140. In FIG. 9, the air outlet 150 is set on the rear wall of the second air chamber 140. It should be understood that, in another embodiment, the air outlet 150 may also be set on the front wall of the second air chamber 140 or on the side wall where the second air chamber 140 contacts external air.

Figure 10:
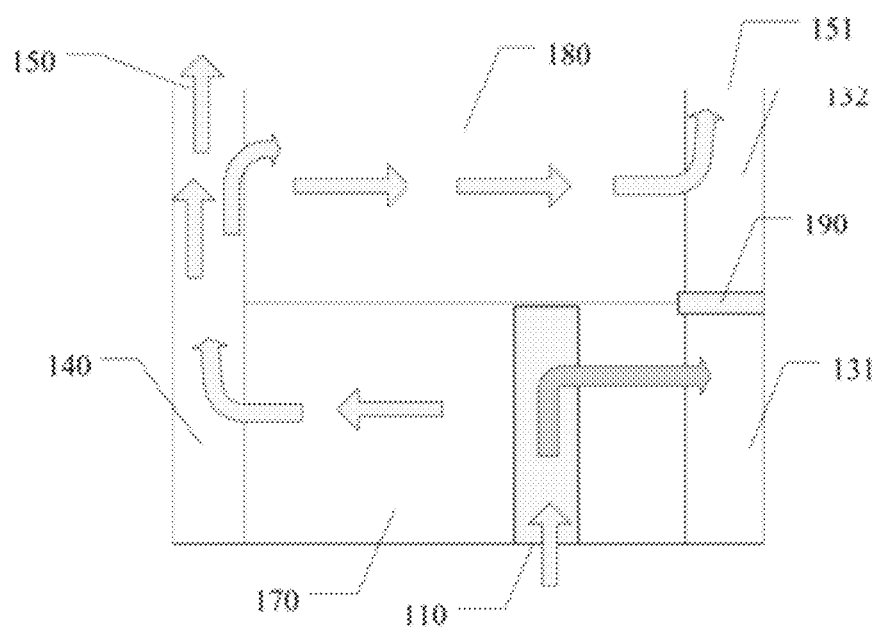
FIG. 10 is a top view of a chassis with horizontal plugged frames according to an embodiment of the present invention.

FIG. 10 is a top view of a chassis with horizontal plugged frames in which front boards and rear boards are installed oppositely by taking an air inlet as a reference direction according to an embodiment of the present invention. In this case, an original board area may include a front board area 170 and a rear board area 180, and an air inlet 110 is located in the front board area. According to FIG. 9, the air inlet 110 in the front board area 170 is not linked to the rear board area 180, that is, the air inlet 110 is partitioned from the rear board area 180. In addition, a first air chamber is also partitioned by a partition plate 190 into two air chambers that correspond to the front board area 170 and the rear board area 180, that is, a first front air chamber 131 and a second front air chamber 132 in FIG. 10, with a second air outlet 151 set on a rear wall 132 of the second front air chamber.

According to FIG. 10, external air enters the first front air chamber 131 through the air inlet 110 in the front board area 170, and arrives at the second air chamber 140 after passing through the front board area Because an air outlet 150 is set in the second air chamber 140, part of the air flow is expelled through the air outlet 150. The other part of the air flow passes through the rear board area 180 to dissipate heat of boards in the rear board area 180; the air flow after heat dissipation arrives at the second front air chamber 132, and because a second air outlet 151 is set on the rear wall of the second front air chamber 132, the air flow after heat dissipation is expelled through the second air outlet 151.

Figure 11:
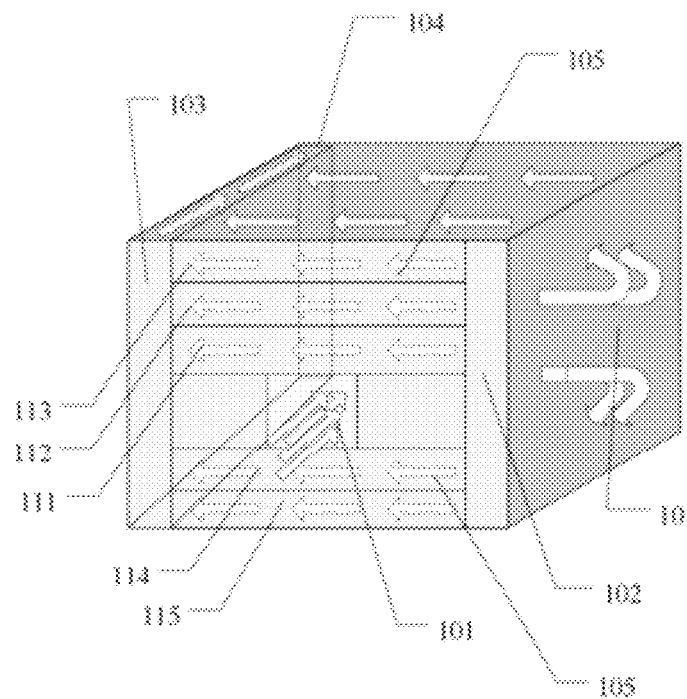
FIG. 11 is a schematic structural diagram of a communication device according to an embodiment of the present invention.

As shown in FIG. 11, an embodiment of the present invention further provides a communication device. The communication device includes a chassis with horizontal plugged frames 10 and a plurality of boards (for example, boards 111 to 115 in FIG. 11). The plurality of boards are inserted in a board area 105 of the chassis with horizontal plugged frames 10. The structure of the chassis with horizontal plugged frames 10 may be as shown in any one of the foregoing embodiments. The chassis with horizontal plugged frames 10 may dissipate heat of the boards that are inserted in the board area 105 (for example, boards 111 to 115 in FIG. 11).

Through the foregoing technical solutions according to the embodiments of the present invention, air enters the first air chamber in the chassis with horizontal plugged frames through the air inlet that is located in the board area, and flows towards the board area after being sufficiently mixed in the first air chamber. In this way, the air volume is evenly distributed to the board area, which increases efficiency of heat dissipation. In addition, because the air inlet is located in the board area, it is not necessary to expand the space of the chassis with horizontal plugged frames. This makes the chassis compact and increases cost-effectiveness of heat dissipation. Further, the air flow may be accelerated by setting a fan in the linking area between the air inlet and the first air chamber or setting a fan at the air outlet in the second air chamber, which further increases the efficiency of heat dissipation.

The foregoing description is merely several exemplary embodiments of the present invention. Those skilled in the art may make various modifications or variations according to the disclosure of the application documents without departing from the spirit and scope of the present invention.

What is claimed is:

1. A chassis with horizontal plugged frames, comprising:
an air inlet, a board area, a first air chamber, a second air chamber, and an air outlet, wherein:
the air inlet is set in the board area and is linked to the first air chamber;
the air outlet is set on a wall of the second air chamber;
the first air chamber is located on one side of the board area and linked to the board area; and
the second air chamber is located on the other side of the board area and linked to the board area; wherein:
the chassis with horizontal plugged frames further includes front boards and rear boards;
the chassis with horizontal plugged frames further comprises a front-to-rear channel;
the board area comprises a front board area and a rear board area; and
the air inlet is set in the front board area and is linked to the rear board area through the front-to-rear channel.

2. The chassis with horizontal plugged frames according to claim 1, wherein a fan is set in a linking area between the air inlet and the first air chamber.

3. The chassis with horizontal plugged frames according to claim 1, wherein a fan is set at the air outlet.

4. The chassis with horizontal plugged frames according to claim 1, wherein the air inlet is set in the board area, and the air inlet is set in a middle part of the board area; or the air inlet is laterally set at a preset position in the board area.

5. A communication device, comprising:
a plurality of boards and a chassis with horizontal plugged frames, wherein the chassis with horizontal plugged frames comprises: an air inlet, a board area, a first air chamber, a second air chamber, and an air outlet, wherein:
the air inlet is set in the board area and is linked to the first air chamber;
the air outlet is set on a wall of the second air chamber;
the first air chamber is located on one side of the board area and linked to the board area;
the second air chamber is located on the other side of the board area and linked to the board area; and
the plurality of boards are inserted in the board area; wherein:
the chassis with horizontal plugged frames further includes front boards and rear boards that are installed oppositely;
the chassis with horizontal plugged frames further comprises a front-to-rear channel;
the board area comprises a front board area and a rear board area; and
the air inlet is set in the front board area and is linked to the rear board area through the front-to-rear channel.

6. The communication device according to claim 5, wherein a fan is set in a linking area between the air inlet and the first air chamber.

7. The communication device according to claim 5, wherein a fan is set at the air outlet.

8. A chassis with horizontal plugged frames, comprising:
an air inlet, a board area, a first air chamber, a second air chamber, and an air outlet, wherein:
the air inlet is set in the board area and linked to the first air chamber;
the air outlet is set on a wall of the second air chamber;
the first air chamber is located on one side of the board area and linked to the board area; and
the second air chamber is located on the other side of the board area and linked to the board area; wherein:
the chassis with horizontal plugged frames further includes front boards and rear boards;
the board area comprises a front board area and a rear board area;
the air inlet is set in the front board area and is partitioned from the rear board area; and
the first air chamber is partitioned by a partition plate into a first front air chamber and a second front air chamber that correspond to the front board area and the rear board area, and a second air outlet is set on a rear wall of the second front air chamber.

9. The chassis with horizontal plugged frames according to claim 8, wherein a fan is set in a linking area between the air inlet and the first air chamber.

10. The chassis with horizontal plugged frames according to claim 8, wherein a fan is set at the air outlet.

11. The chassis with horizontal plugged frames according to claim 8, wherein the air inlet is set in the board area, and the air inlet is set in a middle part of the board area; or the air inlet is laterally set at a preset position in the board area.

12. A communication device, comprising:
a plurality of boards and a chassis with horizontal plugged frames, wherein the chassis with horizontal plugged frames comprises: an air inlet, a board area, a first air chamber, a second air chamber, and an air outlet, wherein:

the air inlet is set in the board area and is linked to the first air chamber;

the air outlet is set on a wall of the second air chamber;

the first air chamber is located on one side of the board area and linked to the board area;

the second air chamber is located on the other side of the board area and linked to the board area; and the plurality of boards are inserted in the board area; wherein:

the chassis with horizontal plugged frames further includes front boards and rear boards that are installed oppositely;

the board area comprises a front board area and a rear board area;

the air inlet is set in the front board area and is partitioned from the rear board area; and the first air chamber is partitioned into a front air chamber and a second air chamber that correspond to the front board area and the rear board area, and a second air outlet is set on the rear wall of a second front air chamber.

13. The communication device according to claim 12, wherein a fan is set in a linking area between the air inlet and the first air chamber.

14. The communication device according to claim 12, wherein a fan is set at the air outlet.

* * * * *